(12) United States Patent
Carcia et al.

(10) Patent No.: US 7,005,798 B2
(45) Date of Patent: Feb. 28, 2006

(54) FLEXIBLE ORGANIC ELECTRONIC DEVICE WITH IMPROVED RESISTANCE TO OXYGEN AND MOISTURE DEGRADATION

(75) Inventors: Peter Francis Carcia, Wilmington, DE (US); Robert Scott McLean, Hockessin, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 22 days.

(21) Appl. No.: 10/856,512

(22) Filed: May 28, 2004

(65) Prior Publication Data

US 2004/0217348 A1    Nov. 4, 2004

Related U.S. Application Data

(60) Division of application No. 10/374,611, filed on Feb. 26, 2003, now Pat. No. 6,720,203, which is a continuation of application No. 09/551,394, filed on Apr. 17, 2000, now abandoned.

(60) Provisional application No. 60/137,928, filed on Jun. 7, 1999, provisional application No. 60/131,416, filed on Apr. 28, 1999.

(51) Int. Cl.
*H01J 1/62* (2006.01)
*H01L 21/56* (2006.01)
*H01L 31/12* (2006.01)

(52) U.S. Cl. .............. 313/498; 313/505; 313/506; 313/511; 313/512; 428/690; 428/917; 428/331; 438/116; 438/118; 438/127; 257/E31.095

(58) Field of Classification Search .......... 313/504, 313/511, 505, 506, 512; 252/299.01, 582; 430/2, 20; 438/116, 118, 127; 428/690, 428/917; 257/E31.095, E31.096
See application file for complete search history.

(56) References Cited

U.S. PATENT DOCUMENTS

| | | | | |
|---|---|---|---|---|
| 3,315,111 A | * | 4/1967 | Jaffe et al. ................ | 313/503 |
| 3,341,915 A | * | 9/1967 | Knochel et al. .......... | 445/52 |
| 3,497,750 A | * | 2/1970 | Knochel et al. .......... | 313/503 |
| 3,864,715 A | * | 2/1975 | Mastrangelo .............. | 257/49 |
| 3,993,811 A | * | 11/1976 | Walles .................... | 428/35.9 |
| 4,104,555 A | * | 8/1978 | Fleming .................. | 313/512 |

(Continued)

FOREIGN PATENT DOCUMENTS

DE        196 03 746 A1 *    4/1997

(Continued)

OTHER PUBLICATIONS

Mikio, Ichise, Organic Thin Film Electroluminescent Element, *Patent Abstracts of Japan*, Publication No. 09129368, May 16, 1997.

*Primary Examiner*—Shean C. Wu

(57) ABSTRACT

The present invention relates to a device having a flexible organic electronic device comprising in the order listed:
a) a first flexible composite barrier structure comprising at least one layer of a first polymeric film and at least one layer of a first barrier material, the first barrier structure having a first inner surface,
b) at least one first electrical contact layer,
c) at least one active layer comprising an organic active material, said active layer having dimensions defined by a length and a width,
d) at least one second electrical contact layer,
e) a second flexible composite barrier structure comprising at least one layer of a second polymeric film and at least one layer of a second barrier material, the second barrier structure having a second inner surface,
wherein at least one of the first and second composite barrier structures is light-transmitting and the first and second composite barrier structures are sealed together to envelop the at least one active layer.

22 Claims, 5 Drawing Sheets

U.S. PATENT DOCUMENTS

| | | | |
|---|---|---|---|
| 4,458,177 A * | 7/1984 | Hunter et al. | 313/511 |
| 4,767,679 A * | 8/1988 | Kawachi | 428/690 |
| 5,189,405 A * | 2/1993 | Yamashita et al. | 313/512 |
| 5,427,858 A * | 6/1995 | Nakamura et al. | 428/421 |
| 5,488,266 A * | 1/1996 | Aoki et al. | 313/509 |
| 5,652,067 A * | 7/1997 | Ito et al. | 428/690 |
| 5,686,360 A * | 11/1997 | Harvey et al. | 438/28 |
| 5,757,126 A * | 5/1998 | Harvey et al. | 313/506 |
| 5,811,177 A * | 9/1998 | Shi et al. | 428/209 |
| 5,952,778 A * | 9/1999 | Haskal et al. | 313/504 |
| 6,150,187 A * | 11/2000 | Zyung et al. | 438/26 |
| 6,268,695 B1 * | 7/2001 | Affinito | 313/504 |
| 6,592,969 B1 * | 7/2003 | Burroughes et al. | 428/332 |
| 6,661,029 B1 * | 12/2003 | Duggal | 257/89 |

FOREIGN PATENT DOCUMENTS

| | | | |
|---|---|---|---|
| EP | 0 777 280 A2 * | | 6/1997 |
| EP | 0 949 850 A1 * | | 10/1999 |
| HU | 190473 B | | 10/1985 |
| HU | 209222 B | | 9/1992 |
| WO | WO 97/16053 | | 5/1997 |
| WO | WO 97/165053 | * | 5/1997 |
| WO | WO 97/42666 | * | 11/1997 |
| WO | WO 99/10939 | * | 3/1999 |
| WO | WO 00/08899 | * | 2/2000 |

* cited by examiner

FLEXIBLE ORGANIC ELECTRONIC DEVICE WITH IMPROVED RESISTANCE TO OXYGEN AND MOISTURE DEGRADATION

This application is a divisional of U.S. application Ser. No. 10/374,611, filed Feb. 2, 2003, now U.S. Pat. No. 6,720,203, B2, issued Apr. 4, 2004, which is a Continuation of U.S. application Ser. No. 09/551,394, filed Apr. 17, 2000, now abandoned, which is a Non-Provisional of U.S. application Ser. No. 60/131,416, filed Apr. 28, 1999, which is a Non-Provisional of U.S. application Ser. No. 60/137,928, filed Jun. 7, 1999.

BACKGROUND OF THE INVENTION

1. Field of the Invention

This invention relates to organic electronic devices in which the active layer is an organic material. More particularly, it relates to electronic devices covered by flexible composite barrier structures.

2. Description of the Related Art

Organic electronic devices include devices that emit light (such as light-emitting diodes that make up displays) or respond to radiant energy (such as photodetectors). Displays may contain active matrix addressing or passive matrix-addressing. In passive matrix displays there is an array of electrode lines for addressing individual pixels arranged in rows and columns; applying a voltage between a particular row and column energizes the pixel with that corresponding address. By analogy with active matrix liquid crystal displays, the polymer electronic device (display) can be addressed at individual pixels using a thin film transistor (TFT) device which switches that pixel on and off. In such a configuration each TFT is electrically connected by to "gate busline" and to "data busline" that also need to be connected to the electrical driver circuitry and thus sealed outside the active device area.

In all such devices, an organic active layer is sandwiched between two electrical contact layers. At least one of the electrical contact layers is light-transmitting so that light can pass through the electrical contact layer. The organic active layer may generate an electric signal in response to light through the at least one light-transmitting electrical contact layer, or may emit light through the light-transmitting electrical contact layer upon application of electricity across the electrical contact layers. In the latter case, the organic active layer contains an electroluminescent material.

It is well known to use organic electroluminescent materials as the active materials in light emitting diodes. Simple organic molecules such as anthracene, thiadiazole derivatives, and coumarin derivatives are known to show electroluminescence. Semiconductive conjugated polymers have also been used as electroluminescent materials, as has been disclosed in, for example, Friend et al, U.S. Pat. No. 5,247,190, Heeger et al., U.S. Pat. No. 5,408,109, and Nakano et al., Published European Patent Application 443 861. The organic materials can be tailored to provide emission at various wavelengths. However, they frequently are degraded by atmospheric gases, particularly oxygen and water vapor. This sensitivity can severely limit the working lifetime of the device if the materials are not properly sealed.

Typically, the device is fabricated on a glass substrate and then hermetically sealed with epoxy to another sheet of glass. In Nakamura et al, U.S. Pat. No. 5,427,858, an electroluminescent device has a protection layer of a fluorine-containing polymer which is optionally covered with a glass shield layer. In Tang, U.S. Pat. No. 5,482,896, a material such as an epoxy or hot melt adhesive is used to seal the edges of an electroluminescent device between a rigid support and a thin (25–50 micron) glass substrate. In Scozzafava et al., U.S. Pat. No. 5,073,446, an electroluminescent device including a glass substrate has an outer capping layer comprised of fused metal particles containing at least 80% indium, in order to prevent oxidation of the second electrical contact layer. However, having glass as a substrate greatly increases the fragility of the device. Moreover, devices having a glass substrates are not flexible at or below room temperature and therefore cannot be conformed to curved surfaces.

Therefore, there is a need to improve the chemical stability of layers in organic electronic devices that are sensitive to environmental elements. There is also a need to improve the durability as well as the flexibility of such devices.

SUMMARY OF THE INVENTION

The present invention relates to a method for improving resistance to oxygen and moisture degradation of a flexible organic electronic device and to a flexible organic electronic device having greatly improved resistance to environmental degradation, particularly oxygen and moisture degradation, and improved durability. The device includes an organic active layer sandwiched between two electrical contact layers, the sandwich being sealed between two flexible composite barrier structures. The flexible composite barrier structures have oxygen and water vapor transport rates of preferably less than 1.0 $cc/m^2/24$ hr/atm.

In one embodiment of the invention, the device comprises in the order listed:

(a) a first flexible composite barrier structure comprising at least one layer of a first polymeric film and at least one layer of a first barrier material;

(b) at least one first electrical contact layer;

(c) at least one active layer comprising an organic active material, said active layer having dimensions defined by a length and a width;

(d) at least one second electrical contact layer;

(e) a second flexible composite barrier structure comprising at least one layer of a second polymeric film and at least one layer of a second barrier material;

wherein at least one of the first and second composite barrier structures is light-transmitting, and further wherein the first and second composite barrier structures are sealed together, to envelop the active layer.

In a second embodiment, the device includes a portion of the first electrical contact layer and a portion of the second electrical contact layer which extend beyond the dimensions of the active layer, and the first and second composite barrier structures are further sealed to the portion of the first electrical contact layer and the portion of the second electrical contact layer that extend beyond the dimensions of the active layer.

DETAILED DESCRIPTION OF THE PREFERRED EMBODIMENTS

The present invention relates to a device having at least, in the order listed, a first flexible composite barrier structure; a first electrical contact layer, a layer containing at least one organic active material; a second electrical contact layer; and a second flexible composite barrier structure.

It is understood that it is necessary to be able to connect the electrical contact layers of the device to external circuitry in order for the device to function. In most cases this circuitry connection can be accomplished by extending the electrical contact layers beyond the dimensions of the active layer for the connection. The composite barrier structures are then sealed together and to the extended portion of the electrical contact layers, with the electrical contact layers continuing beyond the seal. However, it is also possible to use conductive pathways known as vias to connect the electrical contact layers to external circuitry. The via openings can either be formed in each layer as the device is assembled, or formed by drilling through all the layers after the device is assembled. The openings are then plated through using well-known techniques described in, for example, Sinnadurai, Handbook of Microelectronic Packaging and Interconnection Technologies (Electrochemical Publications Ltd., 1985). If vias are used, the openings should be completely sealed around the connecting wires to protect the active layer from exposure to the external environment.

As used herein, the term "flexible" is intended to mean that a planar sheet of the material is less rigid than glass having a thickness of 1 millimeter at room temperature and preferably can be bent at an angle of at least 10° from the plane without breaking. The term "light-transmitting" is intended to mean that the material transmits at least 50% of light in the visible spectrum (400–700 nm). The term "barrier" is intended to mean low permeability to oxygen and water vapor. The term "essentially X" is used to mean that the composition of a particular material is mainly X, and may also contain other ingredients that do not detrimentally affect the functional properties of that material to a degree at which the material can no longer perform its intended purpose.

When layer A is stated to be "adjacent to" a first surface of layer B, it is meant that layer A is closer to a first surface of layer B than it is to a second surface of layer B, such second surface being disposed opposite of the first surface. As used herein, the word "adjacent" does not necessarily mean that layer A is immediately next to the first surface of layer B. Thus, it is entirely possible that a layer C is disposed between layer A and layer B, and it is still true that layer A is adjacent to the first surface of layer B.

Figure 1:
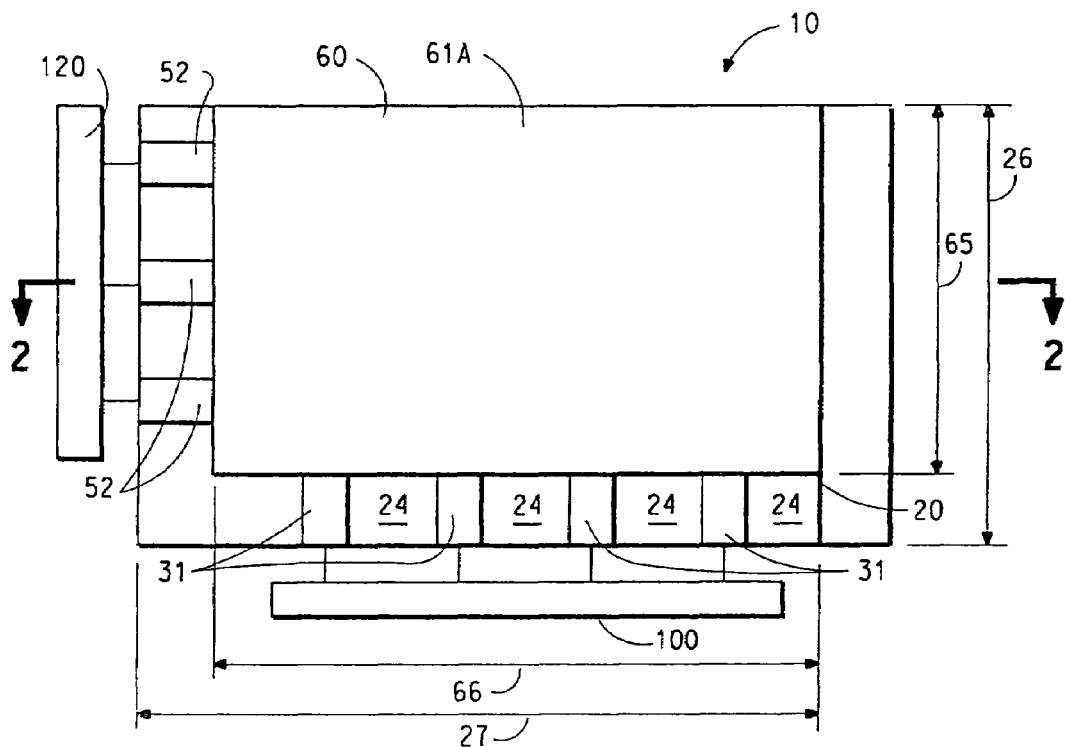
FIG. 1 is a schematic diagram of a top view of an organic electronic device of the invention.
Figure 2:
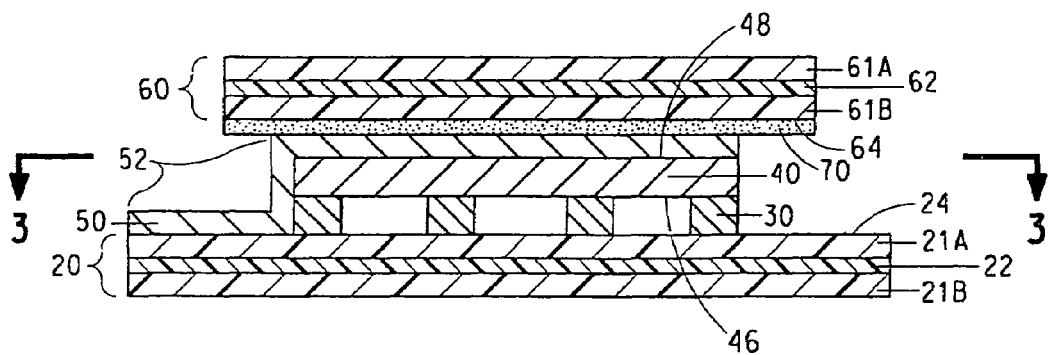
FIG. 2 is a schematic diagram of a cross-section at line 2—2 of the device of FIG. 1 before the device is sealed.
Figure 3:
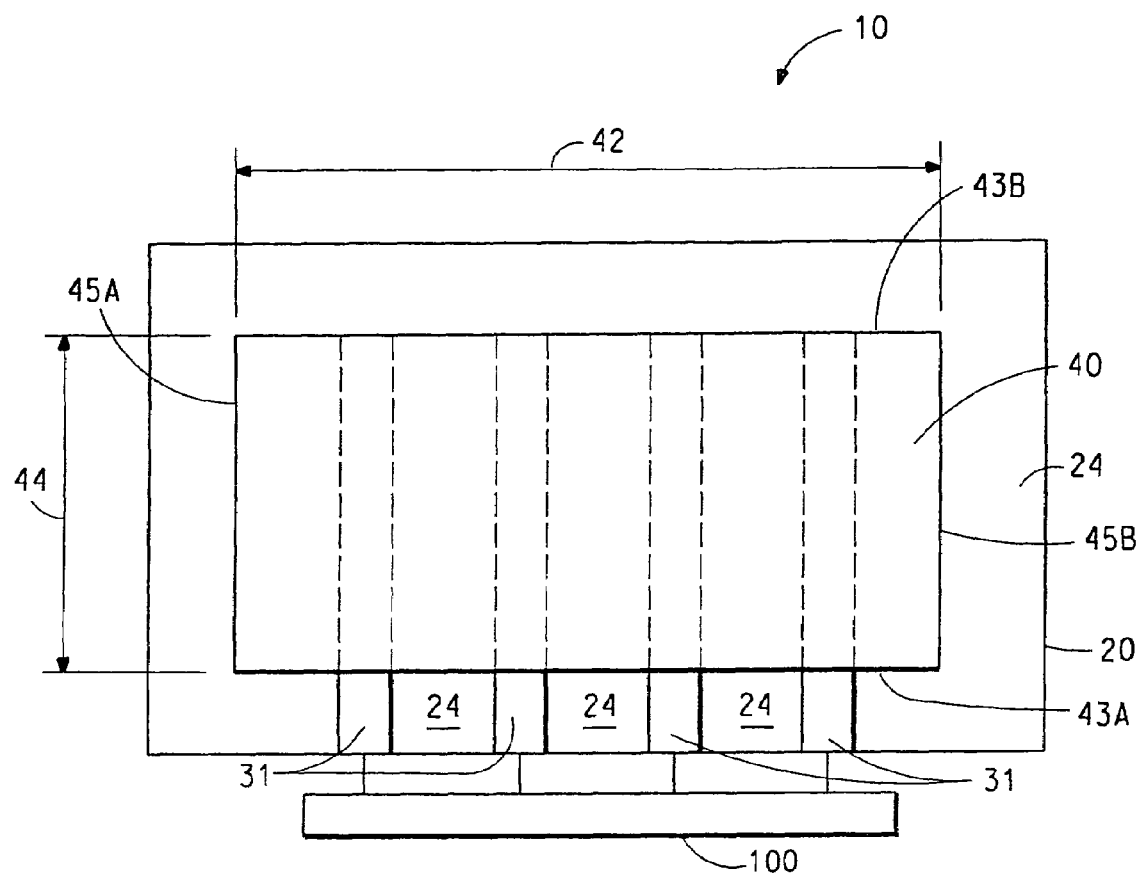
FIG. 3 is a schematic diagram of a top view at line 3—3 of the device shown in FIG. 2.
Figure 4:
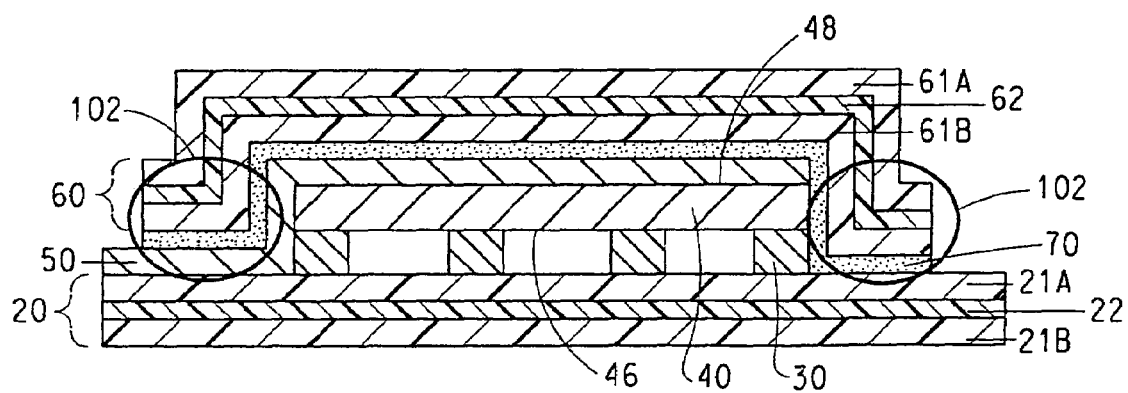
FIG. 4 is a schematic diagram of a cross-section at line 2—2 of the device of FIG. 1 after it is sealed.

FIGS. 1–4 show one example of an organic electronic device 10 according to the invention. As best seen in FIGS. 2 and 4, the device 10 includes a first flexible composite barrier structure 20, a first electrical contact layer 30, an active layer 40, a second electrical contact layer 50 and a second flexible composite barrier structure 60. Depending upon the intended application, the device 10 can be connected directly to an electrical source 100, 120, as best seen in FIGS. 1 and 3. Alternatively, device 10 may be connected to at least one external circuit (not shown) and thereby be a part of an overall electronic system (not shown).

As best seen in FIGS. 2 and 4, the first composite barrier structure 20 has an inner surface 24 and is made up of two polymeric layers 21A and 21B on either side of a layer of barrier material 22. The patterned first electrical contact layer 30 is placed adjacent to the inner surface 24 of the first composite barrier structure 20. As best seen in FIGS. 1 and 3, the first electrical contact layer pattern consists of lines across the width 44 of the active layer and extending beyond an edge 43A of the active layer 40. The first electrical contact layer 30 extends beyond the dimensions of the active layer 40 in areas 31. As best seen in FIGS. 2 and 4, the patterned second electrical contact layer 50 is adjacent to a second surface 48 of the active layer 40 opposite the surface 46 adjacent to the first electrical contact layer 30, such that the active layer 40 is sandwiched between the second electrical contact layer 50 and the first electrical contact layer 30. As best seen in FIGS. 3, the second electrical contact layer pattern consists of lines across to the length 42 of the active layer, and extending beyond another edge 45A, 44 of the active layer 40. As best seen in FIGS. 1 and 2, the second electrical contact layer extends beyond the dimensions of the active layer in area 52. As best seen in FIGS. 2 and 4 the second flexible composite barrier structure 60 is made up of two polymeric layers 61A and 61B on either side of a layer of barrier material 62. On the inner surface 64 of the second barrier structure is an adhesive layer 70.

It is understood that the electrical contact layers 30, 50 may extend beyond any one or more of the active layer edges 43A, 43B, 45A, 45B, depending on the design of the device 10.

It is understood that FIGS. 1–4 have been drawn to represent the relative order of the layers, exaggerating their separation, and are not an accurate depiction of their relative dimensions.

As best seen in FIGS. 1, the dimensions 65, 66 of the second composite barrier structure 60 can be smaller than the dimensions 26, 27 of the first composite barrier structure 20. In the illustrated embodiment the dimensions 65, 66 of the second composite structure 60 are greater than the dimensions 42, 44 (shown in FIG. 3 and not viewable in FIGS. 1, 2 and 4) of the active layer 40 (not shown in FIG. 1, but shown in FIG. 3) in order to effectively seal the active layer 40. In an embodiment (not shown) wherein at least one of the electrical contact layers is also sensitive to environmental degradation, the dimensions of the composite barrier structures should be adjusted to also effectively seal the sensitive electrical contact layer(s). It is thus understood that the relative dimensions 65, 66 of the second composite barrier structure 60 and the dimensions 26, 27 of the first composite barrier structure 20 may vary so long as the composite barrier structures 20, 60 can provide an effective seal for the device 10.

As best seen in FIG. 4, the first and second flexible composite barrier structures 20 and 60 are sealed together by means of adhesive layer 70 outside the dimensions of active layer 40, at region 102. Although not explicitly shown in the drawings, the first and second flexible composite barrier structures 20 and 60 are sealed at all edges such that the active layer 40 is completely enveloped within the sealed edges. Preferably, the first and second flexible composite barrier structure 20 and 60 are sealed in a way that also envelopes all portions of the first and second electrical contact layers 30, 50, except for area 31 of the first electrical contact layer 30 and area 52 of the second electrical contact layer 50.

In the embodiment wherein device 10 is a light-emitting diode, layer 30 can be a cathode (or an anode), layer 40 is a light-emitting layer containing an electroluminescent material, and layer 50 is the respective counterpart electrode, i.e.: an anode (or a cathode), as the case may be.

1. Flexible Composite Barrier Structures

The flexible composite barrier structures 20 and 60 are a composite of at least one polymeric film layer and at least one layer of barrier material. The two composite barrier structures can be made of the same or different material. At least one of the two composite layers should be light-transmitting, preferably transmitting at least 80% in the visible region.

The polymeric films 21A, 21B, 61A, 61B useful in the invention are dimensionally and physically stable under the operating conditions of the device. Examples of suitable polymers include materials containing essentially polyolefins, such as polyethylene and polypropylene; polyesters such as polyethylene terephthalate and polyethylene naphthalate; polyimides; polyamides; polyacrylonitrile and polymethacrylonitrile; perfluorinated and partially fluorinated polymers such as polytetrafluoroethylene and copolymers of tetrafluoroethylene and 2,2-dimethyl-1,3-dioxole; polystyrenes; polycarbonates; polyvinyl chloride; polurethanes; polyacrylic resins, including homopolymers and copolymers of esters of acrylic and/or methacrylic acid; epoxy resins; and novolac resins. More than one layer of polymeric film can be used and combinations of films with different compositions can be used. The multiple layers can be joined together with appropriate adhesives or by conventional layer producing processes such as known coating and/or co-extrusion processes. The polymeric films generally have a thickness in the range of about 0.5–10 mils (12.7–254 microns). When more than one film layer is present, the individual thicknesses can be much less.

It is understood that although the polymeric films 21A, 21B, 61A, 61B contain essentially the polymers described above, these films may also include conventional additives. For example, many commercially available polymeric films contain slip agents or matte agents to prevent the layers of film from sticking together when stored as a large roll. In some cases, the size of such additive may cause irregularities and defects in the adjoining layer of barrier material; such irregularities may detrimentally affect the barrier properties of the composite barrier structure. Where the additives detrimentally affect the composite barrier structure, a polymeric film which is free of slip and matting agents, or in which such agents are small or unobtrusive with respect to the desired thickness of the layer of barrier material 22, 62 is preferred. In some cases, slip coatings can be used.

In the composite structures 20, 60 of the invention, it is preferred to have at least one layer of barrier material 22, 62 sandwiched between at least two layers of polymeric film 21A, 21B, 61A, 61B, as best seen in FIG. 4. Such a composite structure 20, 60 allows for very thin and flexible layers of barrier material which are then protected by the outer layers of polymeric film from damage. There may be more than one layer of barrier material (not shown), each layer may be positioned between two polymeric layers. The barrier layer can be applied to the first layer of polymeric film by one of the processes described below. The second layer of polymeric film can then be applied by lamination or coating, casting or extrusion processes. The second polymeric film layer can be of the same or different composition from the first. For example, a polyester film 1–2 mils (25.4–50.8 microns) thick can be coated with a 2–500 nm thick layer of silicon nitride ($SiN_x$) using plasma enhanced chemical vapor deposition. This layer can then be over-coated with a solution of acrylic resin which is allowed to dry, or an epoxy or novolac resin followed by curing. Alternatively, the silicon nitride coated polyester film can be laminated to a second layer of polyester film. The overall thickness of the composite structure is generally in the range of about 0.5–10 mils (12.3–254 microns), preferably 1–8 mils (25.4–203.2 microns). Such overall thickness is affected by the method used to apply or lay down the composite structure.

As best seen in FIGS. 2–4, an adhesive 70 is generally applied to at least one surface of the composite structures 20, 60. The composite barrier structures 20, 60 are sealed with the adhesive by bringing the inner surfaces 24, 64 of the structures 20, 60 together. The adhesive 70 should be capable not only of sealing the two composite structures together, but of sealing with at least the portion of the electrical contact layer 52 extending beyond the dimensions of the active layer 40. It is understood that an adhesive layer (not shown) may be placed next to the inner surface 24 of the first composite barrier structure 20 in addition to, or instead of adhesive layer 70.

In another embodiment, an adhesive component can be incorporated in at least one of the polymeric films 21A, 61B adjacent to the active layer 40 instead of or in addition to the separate adhesive layer 70. In such a case, a separate adhesive layer 70 may not be necessary to seal the composite barrier structures 20, 60 together.

Suitable adhesives, useful as a separate layer (such as layer 70) and/or as a component of one of the polymeric film layers 21A, 61B include materials containing essentially polymer adhesive resins, amorphous polyesters, copolyesters, polyester blends, nylon, polyurethanes and polyolefins, including polyethylene, polypropylene, polyethylene vinyl alcohol, ethylene vinylacetate copolymer, copolymers of ionomers and acids. It is understood that, where the adhesive layer is adjacent to a light-transmitting layer, the adhesive layer should also be light-transmitting. Similarly, an adhesive component to be incorporated into a light-transmitting polymeric film layer should not detrimentally affect the light-transmitting property of the polymeric film layer.

The barrier material useful in the barrier layers 22, 62 of the invention can be a substance that, when formed as a continuous film 1000 Å in thickness, has an oxygen and water vapor transport rate of less than 1.0 cc/$m^2$/24 hr/atm, preferably less than 0.2 cc/$m^2$/24 hr/atm. Suitable barrier materials include malleable and crack resistant materials that are capable of flexing. Examples of such materials include those containing essentially metals, such as aluminum, nickel, copper, tin and stainless steel, as well as alloys. The barrier material can also be any inorganic materials that are chemically stable to water and oxygen, including inorganic oxides, nitrides, fluorides, and carbides, such as those of silicon, aluminum, indium, titanium, magnesium, hafnium, tantalum, and zirconium, and combinations thereof.

Each of the barrier layers 22, 62 should be a continuous layer that contains a minimal number of defects that increase the material's oxygen and water vapor permeability characteristics so that it can no long function as a barrier. Thus, for example, defects such as pinholes or cracks would be undesirable. It is understood that in addition to the size of defect, the area density of defect (i.e., number of defects per unit area) also may affect the functional characteristics of the barrier material. In order to maintain flexibility, the layer of barrier material generally has a thickness no greater than 1 micron, preferably no greater than 500 nm. In general, the barrier layer may have a thickness in the range of 2–500 nm. However, with some flexible metal films, such as Al foils it is possible to use barrier layers thicker than the preferred ranges.

The barrier layers of the invention are composites containing very thin layers of materials having very low permeability.

The specific choice of polymeric film and barrier material will depend on the processing conditions to which the composite structure will be exposed and the light-transmission requirements. When the composite structure 20 or 60 is used as a support with additional layers built upon it, it may undergo various processing conditions including vapor deposition processing and/or wet chemical etching. In some cases the polymeric film will be the outer layer of the composite structure which is exposed to further processing. If they are subjected to chemical etching conditions, materials such as polyesters, polyimides, and fluorinated polymers are preferred polymeric materials. When the processing involves vapor deposition steps, it is preferred that the polymeric film be a polyimide with high a glass transition temperature (Tg) (e.g., Tg of from 100° C. to 350° C.) or a polyester, more preferably, polyethylene naphthalate. In some cases the barrier material will be the outer layer of the composite structure that is exposed to further processing. The barrier material should be chosen to withstand these conditions. When the composite structure 20 or 60 is added as a last layer, it often will not undergo any further processing. Therefore, the range of choices for the composition of components in the composite barrier structure 20 or 60 placed as a last layer is much broader.

When the composite structure 20 or 60 is adjacent to a light transmitting electrical contact layer, the composite barrier structure should also be light-transmitting in order to transmit light into the device or transmit light generated by the device. Any light-transmitting layer of barrier material can be used in this case, including glasses and inorganic oxides, nitrides, fluorides, and carbides with band gaps greater than 2.5 eV. Particularly preferred light transmitting barrier material are glasses, such as materials essentially made of silicon nitrides having formula (I) below; silicon oxides having formula (II) below; aluminum oxides having formula (III) below; aluminum nitrides having formula IV below:

| | |
|---|---|
| $SiN_w$, wherein w is between 0.8 and 1.2, inclusive | Formula (I) |
| $SiO_x$, wherein w is between 1.5 and 2.0, inclusive | Formula (II) |
| $AlO_y$, wherein y is between 1 and 1.5, inclusive | Formula (III) |
| $AlN_z$, wherein z is between 0.8 and 1.2, inclusive | Formula (IV) |

Also combinations of suitable materials can be used.

When the composite structure is adjacent to an opaque electrical contact layer, there is no need for a light-transmitting composite barrier structure.

To summarize, there are at least the following four types of composite barrier structures that can be used depending on the placement of the structure in the device: (i) the composite barrier structure is used as a support upon which additional layers are processed and is adjacent to a light-transmitting electrical contact layer; (ii) the composite barrier structure is used as a support upon which additional layers are processed and is adjacent to an opaque electrical contact layer; (iii) the composite barrier structure is the last layer applied and is adjacent to a light-transmitting electrical contact layer; and (iv) the composite barrier structure is the last layer applied and is adjacent to an opaque electrical contact layer. The choice of materials used in the component layers of the composite barrier structure is in part dependent upon the type of composite structure.

The polymeric film layer 21A, 21B, 61A, 61B and the barrier material 22, 62 can be combined together using any known application technique that will produce the desired thicknesses and uniformity, including coating processes such as spin coating and spray coating, extrusion coating, casting, screen printing, and vapor deposition processes. A preferred process is to apply the barrier material 22, 62 to the polymeric film 21A or 21B, 61A or 61B, respectively, by a vapor deposition process. Such processes include chemical vapor deposition and plasma enhanced chemical vapor deposition, and physical deposition processes such as evaporation, ion-plating and sputtering. Plasma enhanced chemical vapor deposition is particularly preferred as it causes less heating of the substrate (in this case, the polymeric film 21A, 21B, 61A, or 61B), and the coating flux is more uniform. It thereby provides essentially defect-free layers.

2. First Electrical Contact Layer

The first electrical contact layer 30, is applied to one surface of the first flexible composite barrier structure. This electrical contact layer can include any material capable of injecting (or collecting) charge carriers into (or from, as the case may be) the active layer 40.

Although not shown in the drawings, the first electrical contact layer can be made of one single layer of material or can be a composite of multiple layers of first electrical contact layer material. Where the first electrical contact layer is an anode, (i.e., an electrode that is particularly efficient for injecting or collecting positive charge carriers) it can be, for example materials containing a metal, mixed metal, alloy, metal oxide or mixed-metal oxide, or it can be a conducting polymer. Suitable metals include the Group IB metals, the metals in Groups IV, V, and VI, and the Group VIII transition metals. If the first electrical contact layer is to be light-transmitting, mixed-metal oxides of Groups II, III and IV metals, such as indium-tin-oxide, or a conducting polymer, such as polyaniline, can be used.

Although first electrical contact layer 30 is shown with extended portions 31 to connect the device to external circuitry, it is understood that devices (not shown) that incorporate other means of circuitry connection (such as vias) would not require such extended portions 31. It is further understood that the composition of the first electrical contact layer 30 may vary across the dimensions 26, 65 of the composite barrier layers 20, 60. For example, where the first electrical contact layer 30 includes the extended portions 31, parts of the extended portions that are disposed outside of the sealed composite barrier layers 20, 60 may be contain essentially a material (such as aluminum) that is more resistant to environmental degradation or is a better conductor than the first electrical contact layer composition that is coextensive with the active layer 40. Thus, the first electrical contact layer composition that is coextensive with the active layer 40 may be chosen to provide better electron band-gap matching. At the same time the first electrical contact layer composition in the extended portion 31 may be chosen to provide greater conductivity and increased resistance to environmental degradation outside of the sealed device. The varied composition can be provided by using separate layers of first electrical contact layer material, or by adjusting the alloyed composition within a first electrical contact layer.

The first electrical contact layer 30 is usually applied by a physical vapor deposition process. The term "physical vapor deposition" refers to various deposition approaches carried out in vacuo. Thus, for example, physical vapor deposition includes all forms of sputtering, including ion beam sputtering, as well as all forms of vapor deposition such as e-beam evaporation. A specific form of physical vapor deposition useful in the present in invention is a rf magnetron sputtering.

In general, the first electrical contact layer will be patterned. It is understood that the pattern may vary as desired. The first electrical contact layer can be applied in a pattern by, for example, positioning a patterned mask or photoresist on the first flexible composite barrier structure prior to applying the first electrical contact layer material. Alternatively, the first electrical contact layer can be applied as an overall layer and subsequently patterned using, for example, a photoresist and wet chemical etching. The first electrical contact layer typically has a thickness in the range of 50–500 nm. First electrical contact layer materials and processes for patterning that are well known in the art can be used.

3. Organic Active Layer

Depending upon the application of the device 10, the active layer 40 can be a light-emitting layer that is activated by an applied voltage (such as in a light-emitting diode), or a layer of material that responds to radiant energy and generates a signal with or without an applied bias voltage (such as in a photodetector). Examples of photodetectors include photoconductive cells, photoresistors, photoswitches, phototransistors, and phototubes, and photovoltaic cells, as these terms are described in Markus, John, *Electronics and Nucleonics Dictionary*, 470 and 476 (McGraw-Hill, Inc. 1966).

Where the active layer is light-emitting, the layer will emit light when sufficient bias voltage is applied to the electrical contact layers. The light-emitting active layer may contain any organic electroluminescent or other organic light-emitting materials. Such materials can be small molecule materials such as those described in, for example, Tang, U.S. Pat. No. 4,356,429, Van Slyke et al., U.S. Pat. No. 4,539,507, the relevant portions of which are incorporated herein by reference. Alternatively, such materials can be polymeric materials such as those described in Friend et al. (U.S. Pat. No. 5,247,190), Heeger et al. (U.S. Pat. No. 5,408,109), Nakano et al. (U.S. Pat. No. 5,317,169), the relevant portions of which are incorporated herein by reference. Preferred electroluminescent materials are semiconductive conjugated polymers. An example of such a polymer is poly(p-phenylenevinylene) referred to as PPV. The light-emitting materials may be dispersed in a matrix of another material, with and without additives, but preferably form a layer alone. The active organic layer generally has a thickness in the range of 50–500 nm.

Where the active layer 40 is incorporated in a photodetector, the layer responds to radiant energy and produces a signal either with or without a biased voltage. Materials that respond to radiant energy and are capable of generating a signal with a biased voltage (such as in the case of a photoconductive cells, photoresistors, photoswitches, phototransistors, phototubes) include, for example, many conjugated polymers and electroluminescent materials. Materials that respond to radiant energy and are capable of generating a signal without a biased voltage (such as in the case of a photoconductive cell or a photovoltaic cell) include materials that chemically react to light and thereby generate a signal. Such light-sensitive chemically reactive materials include for example, many conjugated polymers and electro- and photo-luminescent materials. Specific examples include, but are not limited to, MEH-PPV ("Optocoupler made from semiconducting polymers", G. Yu, K. Pakbaz, and A. J. Heeger, *Journal of Electronic Materials*, Vol. 23, pp 925–928 (1994); and MEH-PPV Composites with CN-PPV ("Efficient Photodiodes from Interpenetrating Polymer Networks", J. J. M. Halls et al. (Cambridge group) *Nature* Vol. 376, pp. 498–500, 1995).

A layer 40 containing the active organic material can be applied to the first electrical contact layer 30 from solutions by any conventional means, including spin-coating, casting, and printing. The active organic materials can be applied directly by vapor deposition processes, depending upon the nature of the materials. It is also possible to apply an active polymer precursor and then convert to the polymer, typically by heating.

The active layer 40 is applied over the first electrical contact layer 30, but does not typically cover the entire layer. As best seen in FIGS. 1 and 3, there is a portion 31 of the first electrical contact layer that extends beyond the dimensions of the active layer in order to permit the connection with drive and/or detection circuitry in the finished device.

4. Second Electrical Contact Layer

The second electrical contact layer 50 is applied to the other side of the active layer 40. Although not shown in the drawings, the second electrical contact layer can be made of one single layer of material or can be a composite of multiple layers of material.

The second electrical contact layer can be a material containing essentially any metal or nonmetal capable of injecting (or collecting) charge carriers into (or from, as the case may be) the active layer 40. Generally, where the second electrical contact is a cathode (i.e., an electrode that is particularly efficient for injecting or collecting electrons or negative charge carriers) the cathode can be any metal or nonmetal having a lower work function than the first electrical contact layer (in this case, an anode). Materials for the second electrical contact layer can be selected from alkalil metals of Group I (e.g., Li, Cs), the Group IIA (alkaline earth) metals, the Group II metals, including the rare earths and lanthanide, and the actinides. Materials such as aluminum, indium, calcium, barium, and magnesium, as well as combinations, can be used.

Although second electrical contact layer 50 is shown with extended portions 52 to connect the device to external circuitry, it is understood that devices (not shown) that incorporate other means of circuitry connection (such as vias) would not require such extended portions 52. It is further understood that the composition of the second electrical contact layer 50 may vary across the dimensions 27, 66 of the composite barrier layers 20, 60. For example, where the second electrical contact layer 50 includes the extended portions 52, parts of the extended portions that are disposed outside of the sealed composite barrier layers 20, 60 may be contain essentially a material (such as Aluminum) that is more resistant to environmental degradation and/or is a better conductor than the second electrical contact layer composition that is coextensive with the active layer 40. Thus, the second electrical contact layer composition that is coextensive with the active layer 40 may be chosen to provide better electron band-gap matching. At the same time the second electrical contact layer composition in the extended portion 52 may be chosen to provide greater conductivity and increased resistance to environment degradation outside of the sealed device. The varied composition can be provided by a separate layer of second electrical contact layer material, or could be alloyed within one second electrical contact layer.

The second electrical contact layer is usually applied by a physical vapor deposition process. In general, the second electrical contact layer will be patterned, as discussed above in reference to the first electrical contact layer 30. Similar processing techniques can be used to pattern the second electrical contact layer. The second electrical contact layer typically has a thickness in the range of 50–500 nm. Second electrical contact layer materials and processes for patterning well known in the art can be used.

A portion 52 of the second electrical contact layer will extend beyond the dimensions of the light-emitting layer 40. As with the first electrical contact layer 30, this extended portion 52 allows for the connection to drive and/or detection circuitry in the finished device.

5. Other Optional Layers

It is known to have other layers in organic electronic devices. For example, there can be a layer (not shown) between the first electrical contact layer 30 and the active layer 40 to facilitate electrical charge transport and/or electron band-gap matching of the layers 30, 40 or reduce chemical reactivity between the active layer 40 and the first electrical contact layer 30. Similarly, a layer (not shown) can be placed between the active layer 40 and the second electrical contact layer 50 to facilitate electrical charge transport and/or electron band-gap matching between the layers 40, 50 or reduce chemical reactivity between the active layer 40 and the second electrical contact layer 50. Layers that are known in the art can be used. In addition, any of the above-described layers can be made of multiple layers. Alternatively, some of all of first electrical contact layer 30, active layer 40, and second electrical contact layer 50, may be surface treated to increase charge carrier transport efficiency. Furthermore, additional barrier layers (not shown) can also be placed between one of more sets of the layers 20, 30, 40, 50, 60 to protect them from adverse processing conditions.

The choice of materials for each of the component layers 21A, 22, 22B, 30, 40, 50, 61A, 62, 61B is preferably determined by balancing the goals of providing a device with high electrooptical efficiency.

In many instances, organic electronic devices of the invention can be fabricated by first applying a first electrical contact layer and building up the device from there. It is understood that it is also possible to build up the layers from the second electrical contact layer.

The following examples illustrate certain features and advantages of the present invention.

EXAMPLES

The following examples are illustrative of the invention, but not limiting.

Example 1

A flexible composite barrier structure was formed with polyester film and a thin film barrier of $SiN_x$. The $SiN_x$ was coated using a microwave electron cyclotron resonance (ECR) plasma onto a 0.002 inch (50.8 micron) thick film of polyethylene-terephthalate (PET), Mylar® 200D supplied by E. I. du Pont de Nemours and Company, Inc. (Wilmington, Del.). Prior to deposition, the chamber was evacuated to a pressure of $1.5 \times 10^{-7}$ Torr with a turbo-molecular pump. During deposition, 2 standard cubic centimeters (sccm) of $SiH_4$, 98 sccm of Ar, and 20 sccm of $N_2$ were admitted into the chamber. The plasma was sustained using 150W of microwave power at 2.455 GHz, while the magnetic field was adjusted to about 900 Gauss, corresponding to the resonance condition for electron motion in the plasma. A one hour deposition produced a $SiN_x$ film about 840 Å thick, as determined by atomic force microscopy (AFM). Chemical depth profiling by X-ray photoelectron spectroscopy (XPS) revealed that films were essentially $SiN_x$ (x~1.15) with some oxygen (~10%) and presumably some hydrogen (not measurable with XPS) incorporation. The oxygen transport rate (OTR) at 50% relative humidity through the coated PET film was evaluated with a commercial instrument (MOCON Oxtran 2/20 made by Mocon, Minneapolis, Minn.) and determined to be 0.012 cc $(O_2)/m^2/day/atm$. For reference an uncoated film of Mylar® 200D has an OTR of about 24 cc $(O_2)/m^2/day/atm$. Therefore the $SiN_x$ coating provides a barrier improvement factor of 2000X.

Example 2

A second flexible composite barrier structure was formed with a 200 Å thick film barrier of $SiN_x$. The $SiN_x$ was coated using a microwave ECR plasma onto 0.002 inch (50.8 micron) thick Mylar® 200D PET film. The gas flow conditions during deposition were 2 sccm of $SiH_4$, 98 sccm of Ar, and 20 sccm of $N_2$ at a microwave power of 100 W. The deposition lasted 30 minutes. The OTR of the $SiN_x$ coated PET was subsequently determined to be 0.12 $cc(O_2)/m^2/day/atm$.

Example 3

This example illustrates the OTR of a flexible composite barrier structure having a laminate structure. Lamination of $SiN_x$ coated PET protects the $SiN_x$ coating from mechanical damage, which will compromise barrier properties. PET, 0.002 inch (50.8 micron) thick with about 1000 Å coating of $SiN_x$, produced by microwave plasma Chemical Vapor Deposition (CVD), was laminated to uncoated PET, also 0.002 inch (50.8 micron) thick using a commercial adhesive, 3M 8142, from 3M (St. Paul, Minn.). The laminator had a single rubber roll and was operated at 48° C. and 35 psi. The final structure of the laminated film was PET/1000 Å/$SiN_x$/adhesive/PET. The OTR of this laminated structure was subsequently determined to be 0.00825 cc $(O_2)/m^2/day/atm$.

Example 4

This example illustrates a flexible composite barrier structure having two laminated $SiN_x$ layers. Two PET films, each coated with about 1000 Å of $SiN_x$ by microwave plasma enhanced CVD, were laminated together with an adhesive, using the conditions of Example 3, so that the $SiN_x$ films were to the inside of the structure, and OTR was measured. That is, the structure was PET/$SiN_x$/adhesive/$SiN_x$/PET. Prior to lamination, it was determined that the individual $SiN_x$ coated PET films had an OTR of about 0.0075 cc($O_2$)/$m^2$/day/atm. The OTR of the laminate structure was less than 0.005 cc($O_2$)/$m^2$/day/atm, the lower measuring limit of the MOCON instrument.

Example 5

This example illustrates the formation of a non-transparent composite barrier structure using (a combination of vapor deposited aluminum and layers of barrier polymers is utilized to provide oxygen and moisture barrier)aluminum as the barrier material.

A first metallized film was prepared with polyvinylidene chloride copolymer-polyester-aluminum-polyvinylidene chloride copolymer. A roll of Mylar® LB biaxially oriented polyester film was placed in a vacuum chamber where it was unwound and exposed to evaporated aluminum which condensed on the film surface to a thickness of 400 Å (or an optical density (OD) of 2.8). The metallized film was then solvent coated with a composition that was essentially a copolymer of vinylidene chloride/vinyl chloride/methylmethacrylate/acrylonitrile, over the both sides of the film. The dry coating weight was 1.6 g/$m^2$ on both of the coated sides.

A second metallized film was prepared by coating Mylar® LB film with a polyethyleneimine primer from a 1% solution in water. The dried coating weight was 0.02 to 0.2 g/$m^2$. The primed polyester film was then topcoated with polyvinyl alcohol in a second coater station. Dry polyvinyl alcohol was diluted to a 10% solution using 95–98° C. water and steam sparging to make a coating bath. After cooling, the coating was applied using a reverse gravure coating technique. The dry coating weight was 0.4–1.0 g/$m^2$. The product was then aluminum vacuum metallized as described above on the polyvinyl alcohol side to a thickness of 400 Å(or an OD of 2.8).

A third "plain" or nonmetallized polyester film was coated on one side with a 17% solids tetrahydrofuran solution of a mixture of essentially poly(terephthalic/azeleic acid/ethylene glycol), copolymer. This was the heat sealable layer. The coating was applied by reverse metering coating to a dry coating weight of 6 g/$m^2$.

The first and second metallized films were laminated together via a solvent based polyurethane adhesive such that the polyvinylidene chloride layer(which was over the aluminum) of the first film was adjacent to the aluminum layer of the second film. The third polyester film was then laminated to the combination of the first two films via a solvent based polyurethane adhesive such that the plain polyester surface of the combined first two films was adjacent to the plain polyester film surface of the third film. The basic overall laminate structure was omitting the adhesive and primer layers: polyvinylidine chloride copolymer—polyester—aluminum—polyvinylidene chloride copolymer—aluminum—polyvinyl alcohol —polyester—polyester—solvent coated polyester heat sealable layer. The OTR was measured to be 0.00062 cc/$m^2$/24 hr/atm by an external laboratory.

Example 6

This example illustrates the bond strength of the heat-sealed composite barrier structure.

The composite barrier structure of Example 5 was heat sealed to the following second materials representing a second barrier structure:

Ex. 6-A: 0.004 inch (50.8 micron) thick PET (400D)
Ex. 6-B: 0.004 inch (50.8 micron) thick PET (400D) coated with an unpatterned, electrically conducting ITO film 1500–2000 Å in thickness
Ex. 6-C 0.004 inch (50.8 micron) thick PET (400D) coated with patterned ITO lines, 1500–2000 Å in thickness (1 mm line width/0.75 mm spaces). The composite barrier structure and the second material were positioned such that the heat sealable layer was adjacent to the second material, and adjacent to the ITO layer of the second material, when present. Two 4×4 inch (10.2×10.2 cm) pieces were cut and laid together. These were heat sealed using a Sentinel Brand Machine, Model #12A8–0 (manufactured by Packaging Group Inc., Hyannis, Mass.) with adjustable temperature and timer controls. A one-inch (2.54 cm) seal was attained at the temperature and dwell times indicated below, applying a pressure of 30 psi.

To determine bond strength after the heat seal was completed, the sealed structures were cut into strips one inch (2.54 cm) wide. Depending on film thickness, Scotch Red Colored Cellophane Tape (Type 650) was applied to the thinner of the sealed substrates to prevent breakage at the seal line. The peel strength was then determined on an Instron Universal Testing Instrument, Model 1122 (available from Instron Corp.). A 5 pound full scale load limit was used with the crosshead speed set to run at 2 inches (5.1 cm) per minute. The peel strengths were reported as the average of 4 samples.

The adhesion tests to patterned ITO were measured both perpendicular ($\perp$) and parallel (//) to the ITO lines. Bond strengths were measured after sealing at either 120° C. or 140° C. for 0.5 or 1.0 second. The results are summarized in Table 1 below.

TABLE 1

| | 120° C. | | 140° C. | |
|---|---|---|---|---|
| Example | 0.5 s | 1.0 s | 0.5 s | 1.0 s |
| 6-A | 667 g/in. | 766 g/in. | 864 g/in. | 881 g/in. |
| 6-B | 1276 g/in. | 913 g/in. | 515 g/in. | 358 g/in. |
| 6-C (P-$\perp$) | 554 g/in. | 668 g/in. | 624 g/in. | — |
| 6-C (P-//) | 659 g/in. | 923 g/in. | 916 g/in. | 988 g/in. |

These peel tests indicate that the polyester heat sealable layer bonds equally well, and under some conditions more strongly, to transparent, conducting ITO compared to bonding to PET alone.

Figure 5:
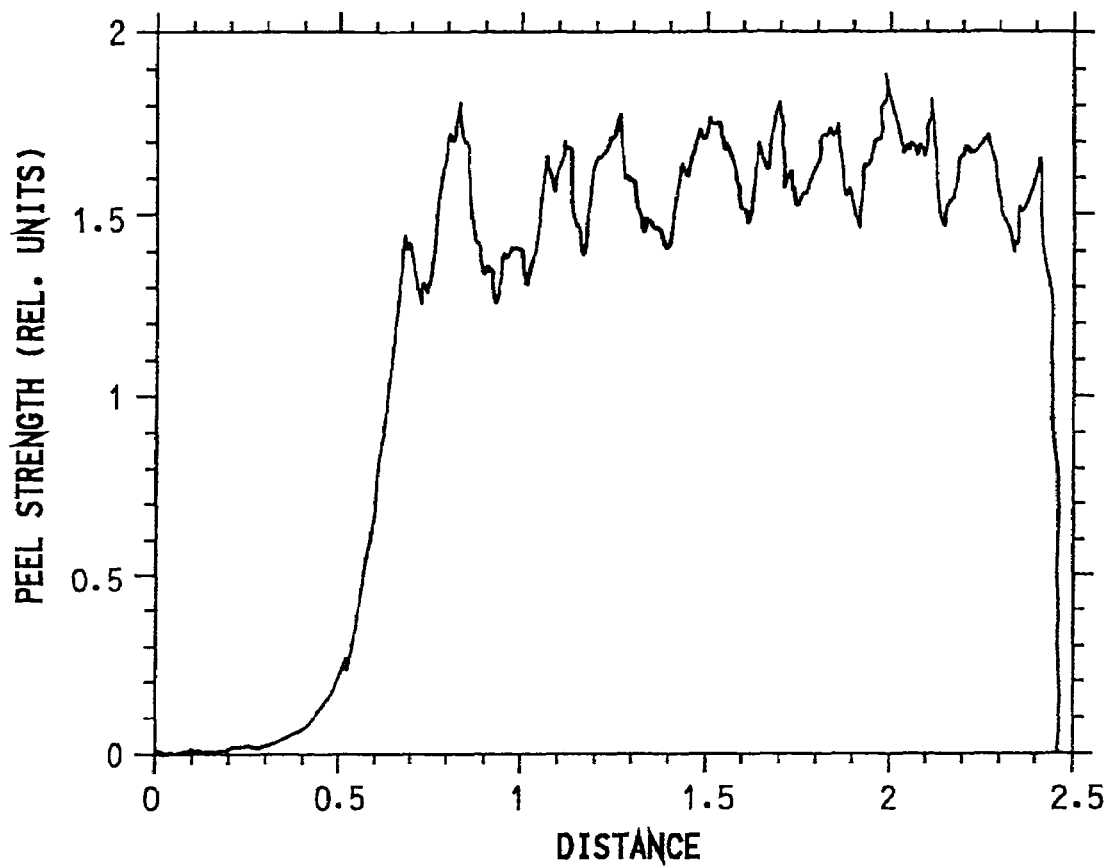
FIG. 5 is a plot of peel strength versus distance when peeling apart a composite barrier structure of the invention sealed to a pattern of electrodes on a polymeric support.
Figure 6:
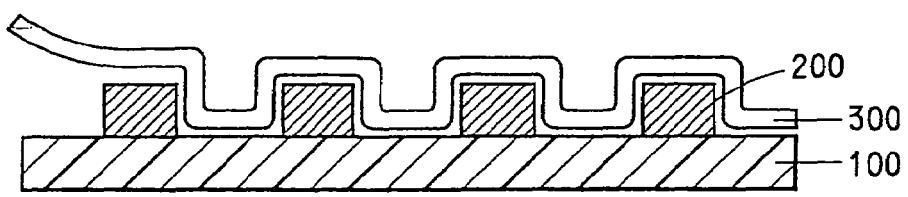
FIG. 6 is a schematic diagram of a composite barrier structure being peeled from a support and an electrode material.

The adhesion of the composite barrier structure to both electrode material and to the support is illustrated in FIGS. 5 and 6. As shown in FIG. 5, the peel strength is plotted versus distance as Sample 6-C (P-$\perp$) is peeled apart. The peel strength varies with regular peaks and valleys corresponding to the different materials (electrode material or polymeric support) that the barrier structure is peeled from. As shown in FIG. 6, the composite barrier structure 300 is peeled alternately from electrode material 200 and polymeric support 400. If the barrier structure 300 bonded to only the support material 400 it would be expected that the plot of peel strength would have a single continuous value, without peaks and valleys.

Example 7

This example illustrates polymer light emitting diode (PLED) device lifetime with a composite barrier structure having silicon nitride barrier layers (Sample 7) as it compares with that of a device without the silicon nitride barrier layer (Comparative sample Y). Ten Sample 7 devices and ten Comparative Y devices were prepared and tested.

The basic PLED device structure of both Sample 7 and Comparative Sample Y included a glass substrate with a transparent conducting anode layer of indium tin oxide over-coated with about 100 nm each of a polymer hole-injecting layer and a yellow light-emitting polymer layer. This was then coated with a thin layer (~20 nm) of a low work function metal and covered with a one micron thick layer of aluminum.

Sample 7 devices were further fabricated as follows: A single layer of 2 mil thick PET (polyethylene terephthalate) about six inches square was coated consecutively on both sides with a silicon nitride barrier layer about 80 nm thick. The silicon nitride layers were deposited by microwave, plasma-enhanced (electron cyclotron resonance (ECR)) chemical vapor deposition (CVD). The conditions during deposition were 150 watts microwave power, 2.7 sccm of silane ($SiH_4$), about 100 sccm of Ar, and 20 sccm of $N_2$. The silicon nitride coated PET was then laminated to another 2 mil thick sheet of non-coated PET using a 2 mil thick, commercial adhesive, as described in Example 3 above, to form the composite barrier structure. Sections of the laminate composite barrier structure, 35 mm×25 mm, were then cut and used to seal PLED devices of about the same area, using a commercial, ultraviolet curable epoxy. A good barrier can prevent device degradation caused by atmospheric gases infiltrating the device.

Comparative Sample Y devices were further prepared as follows: similar PLED devices were also epoxy sealed with a similar PET laminate, but without barrier layers of silicon nitride.

The light emission of Sample 7 and Comparative Sample Y devices was measured four (4) days after device fabrication (storage at ambient conditions) and then measured again after storing the devices in ambient conditions for fifty (50) days after device fabrication.

Figure 7A:
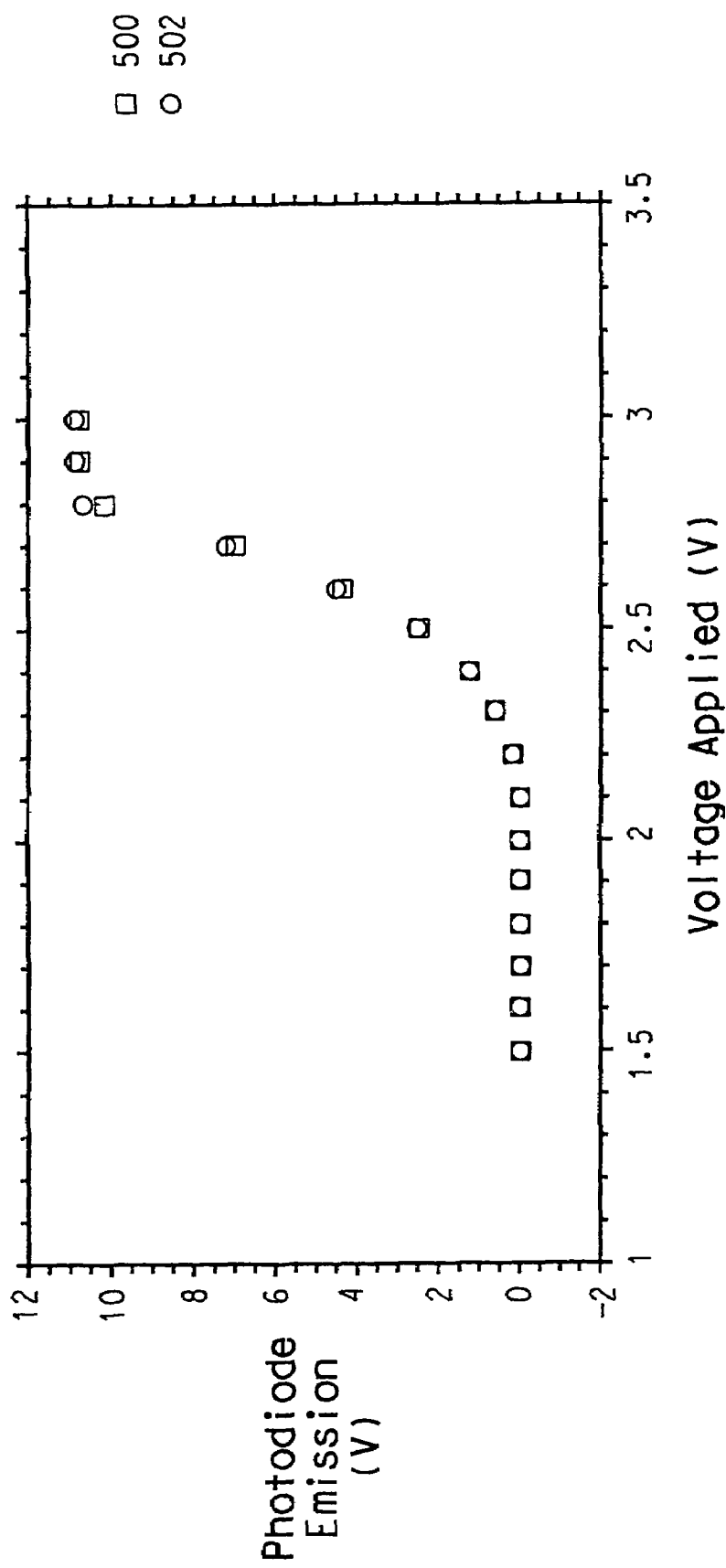
FIG. 7(a) is a plot of light emission of a polymer light emitting device of the present invention at initial time and after fifty days of ambient storage.

FIG. 7(a) shows a plot of light emission of Sample 7 photodiodes initially (500) and then Sample 7 light emission after fifty (50) days (502). There was essentially no change in the light emission of these devices.

Figure 7B:
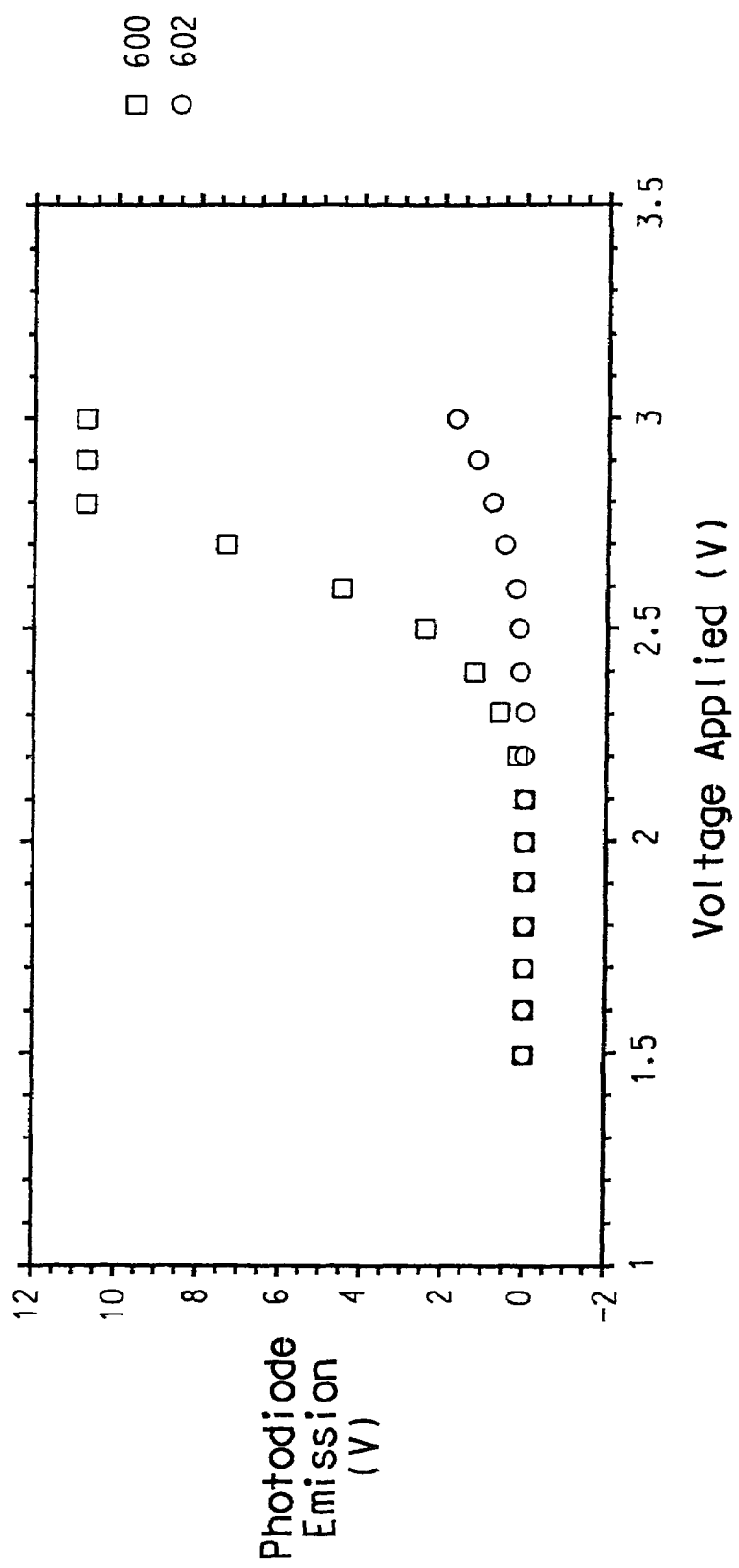
FIG. 7(b) is a plot of light emission of a polymer light emitting device without out the barrier structure of the present invention, at initial time and after fifty days of ambient storage.

In contrast, the performance of Comparative Sample Y devices is markedly different. FIG. 7(b) shows a plot of light emission of Comparative Sample Y photodiodes initially (600) and then Sample Y light emission after 50 days (602). The light emission was significantly reduced after fifty (50) days of ambient storage.

The invention claimed is:

1. A flexible organic electronic device comprising in the order listed:
    a) a first flexible composite barrier structure comprising at least one layer of a first polymeric film and at least one layer of a first barrier material, the first barrier structure having a first inner surface;
    b) at least one first electrical contact layer;
    c) at least one active layer comprising an organic active material, said active layer having dimensions defined by a length and a width;
    d) at least one second electrical contact layer;
    e) a second flexible composite barrier structure comprising at least one layer of a second polymeric film and at least one layer of a second barrier material, the second barrier structure having a second inner surface;
    wherein at least one of the first and second composite barrier structures is light-transmitting;
    wherein the first and second composite barrier structures are sealed together to envelop the at least one active layer.

2. The device of claim 1 wherein a portion of the first electrical contact layer and a portion of the second electrical contact layer extend beyond the dimensions of the active layer, wherein the first and second composite barrier structures are also sealed to the extended portions of the first and second electrical contact layers.

3. The device of claim 1 wherein the one second electrical contact layer comprises a material having a lower work function than the first electrical contact layer.

4. The device of claim 1 wherein the first electrical contact layer is an anode and the second electrical contact layer is a cathode.

5. The device of claim 1 wherein the first and second polymeric films of the first and second composite barrier structures are selected from polyolefins, polyesters, polyimides, polyamides, polyacrylonitrile and polymethacrylonitrile; perfluorinated and partially fluorinated polymers, polycarbonates, polyvinyl chloride, polurethanes, polyacrylic resins, epoxy resins, and novolac resins.

6. The device of claim 1 wherein the first and second barrier materials are independently selected from metals, metal alloys, inorganic oxides, inorganic nitrides, inorganic carbides, inorganic fluorides, and combinations thereof.

7. The device of claim 1 wherein the first flexible composite barrier structure and the first electrical contact layer are light-transmitting.

8. The device of claim 7 wherein the first and second polymeric films in the first composite barrier material are selected from polyethylene terephthalate, polyethylene naphthalate, polyimide, and combinations thereof.

9. The device of claim 1 wherein the barrier material is selected from aluminum, nickel, chromium, copper, tin, stainless steel, and alloys thereof.

10. The device of claim 1 wherein the a barrier material selected from inorganic oxides, inorganic nitrides, inorganic fluorides, inorganic carbides, and combinations thereof.

11. The device of claim 1 wherein the layer of first and second barrier materials has a thickness in the range of 2–500 nm.

12. The device of claim 1 wherein the first flexible composite barrier structure comprises two layers of polymeric film with a layer of the first barrier material therebetween.

13. The device of claim 1 wherein the second flexible composite barrier structure comprises two layers of polymeric film with a layer of the second barrier material there between.

14. The device of claim 1 wherein the first flexible composite barrier structure further comprises a layer of adhesive on the first inner surface.

15. The device of claim 1 wherein the second flexible composite barrier structure further comprises a layer of adhesive on the second inner surface.

16. The device of claim 1 wherein at least one of the first inner surface and the second inner surface contains an adhesive component.

17. The device of claim 14 or claim 15 wherein the adhesive is selected from polymer adhesive resins, amorphous polyesters, copolyesters, polyester blends, nylon, polyurethanes, polyolefins, vinyl alcohol, ethylene vinylacetate copolymer, copolymers of ionomers and acids, and combinations thereof.

18. The device of claim 16 wherein the adhesive component is selected from polymer adhesive resins, amorphous polyesters, copolyesters, polyester blends, nylon, polyurethanes, polyolefins, vinyl alcohol, ethylene vinylacetate copolymer, copolymers of ionomers and acids, and combinations thereof.

19. The device of claim 1, wherein the active layer includes electroluminescent material.

20. The device of claim 1, wherein the active layer includes a conjugated polymer.

21. An electroluminescent display containing the device of claim 1.

22. A photodetector containing the device of claim 1.

* * * * *